(12) United States Patent
Ori et al.

(10) Patent No.: US 7,917,036 B2
(45) Date of Patent: Mar. 29, 2011

(54) BI-DIRECTIONAL OPTICAL MODULE

(75) Inventors: Teijiro Ori, Saitama (JP); Koichiro Masuko, Yachiyo (JP)

(73) Assignee: Fujikura Ltd., Tokyo (JP)

( * ) Notice: Subject to any disclaimer, the term of this patent is extended or adjusted under 35 U.S.C. 154(b) by 189 days.

(21) Appl. No.: 12/199,302

(22) Filed: Aug. 27, 2008

(65) Prior Publication Data
US 2009/0129783 A1    May 21, 2009

Related U.S. Application Data (63) Continuation of application No. PCT/JP2006/303787, filed on Feb. 28, 2006.

(51) Int. Cl.
*H04B 10/00*    (2006.01)

(52) U.S. Cl. ......... 398/136; 398/138; 398/159; 398/164

(58) Field of Classification Search .................. 398/136, 398/138, 135, 128, 130, 159, 164
See application file for complete search history.

(56) References Cited

U.S. PATENT DOCUMENTS
2005/0084268 A1    4/2005    Weigert

FOREIGN PATENT DOCUMENTS

| | | | |
|---|---|---|---|
| CN | 2393272 Y | | 8/2000 |
| CN | 2393272 (Y) | * | 8/2000 |
| CN | 2513121 Y | | 9/2002 |
| JP | 5-87973 U | | 11/1993 |
| JP | 2003-209315 | * | 7/2003 |
| JP | 2003-209315 A | | 7/2003 |
| TW | 2003-04558 | | 10/2003 |
| TW | 2003-7149 | | 12/2003 |
| TW | 594093 B | | 6/2004 |

* cited by examiner

*Primary Examiner* — M. R. Sedighian
(74) *Attorney, Agent, or Firm* — Sughrue Mion, PLLC (57) ABSTRACT

An optical transceiver is provided which includes: a bi-directional optical subassembly; a printed circuit board which transmits and receives light for the bi-directional optical subassembly; and an outer casing which covers the bi-directional optical subassembly and the printed circuit board. The bi-directional optical subassembly includes: a laser diode; a photodiode; a stem on which to laser diode and the photo diode are mounted; a cap, which cooperates with the stern to seal the laser diode and the photodiode; and a crosstalk reducing structure for reducing optical and/or electric crosstalk. The crosstalk reducing structure may include a layer which is formed on an inner surface of the cap and is able to absorb an infrared ray.

18 Claims, 13 Drawing Sheets

BI-DIRECTIONAL OPTICAL MODULE

TECHNICAL FIELD

The present invention relates to a bi-directional optical module, and more particularly, to a bi-directional optical subassembly constituting the main part of the bi-directional optical module, and a transceiver which incorporates the subassembly.

BACKGROUND ART

In recent years, optical fibers are developing rapidly in subscriber system communication networks to satisfy to market demand for high speed and high capacity communication. A wavelength division multiplexing (WDM) system is spotlighted as a communication method. In the WDM system, a single mode optical fiber is used for transmitting and receiving on different wavelengths, 1310 nm and 1490 nm. A passive optical network (PON) system is noted in which a central office serves multiple end users. To provide for the PON system, a bi-directional optical module for an optical line terminal (OLT) for transmitting on the wavelength of 1490 nm and receiving on the wavelength of 1310 nm for the central office, and a bi-directional optical module for an optical network unit (ONU) for transmitting on the wavelength of 1310 nm and receiving on the wavelength of 1490 nm for an end user are developing rapidly. Under such circumstances, there is a demand for compact, low-cost ONU modules in vast numbers.

A bi-directional optical subassembly (hereinafter, referred to as "BOSA") constituting the main part of a bi-directional optical module usually include two packages for a laser diode (LD) and a photodiode (PD) (packaged individually with a can cap called "TOY-CAN"), a fiber pigtail, a WDM filter, and a housing for holding the above components. The can cap for to LD and the can cap for the PD are positioned to form a right angle. Connecting pins for the LD and to PD also form a right angle. The distance between the pins must be long in order to reduce electric crosstalk between the transmitter and the receiver.

The BOSA with two TO-CANs often has a limited degree of freedom in design, and is complicated. In configuration. Further, manufacture of such a BOSA requires a large number of steps, and manufacturing cost cannot be reduced.

To address the above problems, a structure has been proposed in which the LD/PD chips and optical/electric systems therefor a collectively accommodated in a single TO-CAN (for example, see United States Patent Application, Publication No. 2005/0084268).

However, in the structure in which the optical and electric elements for transmitting and receiving are accommodated together in the TO-CAN, optical interference such as optical crosstalk (i.e., stray light) and electric interference such as electric crosstalk are obstacles in providing a compact and low-cost structure.

SUMMARY OF THE INVENTION

Exemplary embodiments of the present invention overcome the above disadvantages and other disadvantages not described above. However, the present invention is not required to overcome the disadvantages described above, and an exemplary embodiment of the present invention may not overcome any of the problems described above.

In view of the problems mentioned above, an object of the present invention is to provide an optical module in which optical elements for transmitting and receiving are efficiently contained in a single TO-CAN package, and which can significantly improve (i.e., reduce) crosstalk that ha been considered as unavoidable.

To address the problems described above, a tint aspect of the invention is a bi-directional optical subassembly, which includes: a laser diode; a photodiode; a stem for mounting the laser diode and the photodiode; a cap which cooperates with the stem to seal the laser diode and the photodiode, cooperating with the stem; and a crosstalk reducing structure for reducing optical and/or electric crosstalk.

A second aspect is characterized in that, in the first aspect, the crosstalk reducing structure includes a layer which is formed on an inner surface of the cap and is able to absorb an infrared ray.

A third aspect is characterized in that, in the second aspect the layer includes a black-colored plating layer.

A fourth aspect is characterized in that, in the second aspect the layer includes a resin layer.

A fifth aspect is characterized in that, in the first aspect, the crosstalk reducing structure includes a block which is disposed between the laser diode and the photodiode, and is able to physically prevent stray light from traveling from the laser diode to the photodiode.

A sixth aspect is characterized in that, in the first aspect, the block includes a circuit board on which electronic parts (e.g., a laser diode and/or a photodiode) are mounted.

A seventh aspect is characterized in that, in the first aspect, the crosstalk reducing structure includes resin which is disposed behind the laser diode and is able to absorb the light from behind the LD.

An eighth aspect is characterized in that, in the seventh aspect, the bi-directional optical subassembly fisher includes a silicon substrate on which the laser diode and the photodiode are mounted, and the resin is provided on the silicon substrate.

A ninth aspect is characterized in that in the seventh aspect, the stem includes a disk-shaped base, and a protruding part protruding vertically from the base and having a silicon substrate thereon on which the laser diode and the photodiode are mounted; and the ream is provided on the base of the steam.

A tenth aspect is characterized in that, in the first aspect, the stem includes a disk-shaped base, and a protruding part protruding vertically from the base and having a silicon substrate thereon on which the laser diode and the photodiode are mounted; and a group of transmitter lead pins and a group of receiver lead pins are provided to penetrate the stem; and a stem protruding part having ground potential is provided near the group of transmitter lead pins.

An eleventh aspect is characterized in that, in the first aspect, the bi-directional optical subassembly further includes a transimpedance amplifier for amplifying a receiving signal from the photodiode, and the crosstalk reducing structure includes: a pair of wires which connect the laser diode or an electrode pad connected to the laser diode with the transmitter lead pin; a pair of wires which connects the photodiode or an electrode pad connected to the photodiode with the transimpedance amplifier; and a pair of wires which connects the transimpedance amplifier to the receiver lead pin, and the pairs of wires are substantially perpendicular to one another.

A twelfth aspect is characterized in that, in the first aspect, the stem includes a disk-shaped base, and a protruding part protruding vertically from the base and having a silicon substrate thereon on which the laser diode and the photodiode are mounted; a plurality of lead pins for electrical connection which includes transmitter lead pins and receiver lead pins is provided to penetrate the stem; and the lead pins are divided into two groups, a group of transmitter lead pins and a group of receiver lead pins, said groups being disposed at opposite sides of the stem protruding part, the lead pins disposed parallel to one another, and a printed circuit board having a ground layer as an inner layer is provided between the groups of the lead pins.

A thirteenth aspect is characterized in that, in the first aspect, the bi-directional optical subassembly further includes: a receptacle; and an optical filter provided at an optical input/output terminal at a cap side of the receptacle, and angled at a predetermined angle with respect to an optical axis.

A fourteenth aspect is an optical transceiver, which includes: a bi-directional optical subassembly which includes: a laser diode, a photodiode, a cap, which cooperates with the stem to seal the laser diode and the photodiode, and a crosstalk reducing structure which reduces at least one of optical and electric crosstalk; a printed circuit board which transmits and receives light for the bi-directional optical subassembly; and a casing, which for covers the bi-directional optical subassembly and the printed circuit board.

A fifteenth aspect is characterized in that, in the fourteenth aspect, the crosstalk reducing structure includes a layer which is formed on an inner surface of the cap and absorbs an infrared ray.

A sixteenth aspect is characterized in that, in the fourteenth aspect, the crosstalk reducing structure includes a block which is disposed between the laser diode and the photodiode, and physically prevents stray light from traveling from the laser diode to the photodiode.

A seventeenth aspect is characterized in that, in the fourteenth aspect, the crosstalk reducing structure includes resin which is disposed behind the laser diode and absorbs the light behind the LD.

An eighteenth aspect is characterized in that, in the fourteenth aspect, the stem includes a disk-shaped base, and a protruding part protruding vertically from the base and having a silicon substrate thereon on which the laser diode and the photodiode are mounted; and a group of transmitter lead pins and a group of receiver load pins, which penetrate the stem; and a stem protruding part having ground potential is provided near the group of transmitter lead pins.

A nineteenth aspect is characterized in that, in the fourteenth aspect, the optical transceiver further includes a transimpedance amplifier which amplifies a receiving signal from the photodiode, and the crosstalk reducing structure includes: a pair of wires which connect the laser diode, or an electrode pad connected to the laser diode with the transmitter lead pin; a pair of wires which connect the photodiode or an electrode pad connected to the photodiode with the transimpedance amplifier; and a pair of wires which connect the transimpedance amplifier to the receiver lead pin, and the pair of wires am provided to be substantially perpendicular to one another.

A twentieth aspect is characterized, in that, in the fourteenth aspect, the optical transceiver further includes: a receptacle; and an optical filter provided at an optical input/output terminal at a cap side of the receptacle, and angled at a predetermined angle with respect to an optical axis.

According to exemplary embodiments of the invention, the number of components can be significantly reduced while maintaining or even improving its performance. Due to its simple structure and easy manufacture, exemplary embodiments of the invention can be mass-produced at a lower cost.

These and other objects, operations, and advantageous effects of the invention will become apparent to those skilled in the art from accompanying drawings and the description of the embodiments of the invention.

Though exemplary embodiments of the present invention may have the above discussed advantages, exemplary embodiments need not have the above discussed advantages.

BRIEF DESCRIPTION OF THE DRAWINGS

The above and/or other aspects of the present invention will become apparent and more readily appreciated from the following description of the exemplary embodiments, taking in conjunction with to accompanying drawings, in which.

DETAILED DESCRIPTION OF EXEMPLARY EMBODIMENTS OF THE INVENTION

Exemplary embodiments of the present invention will be described below, but it is to be understood that the invention is not limited thereto.

Figure 1:
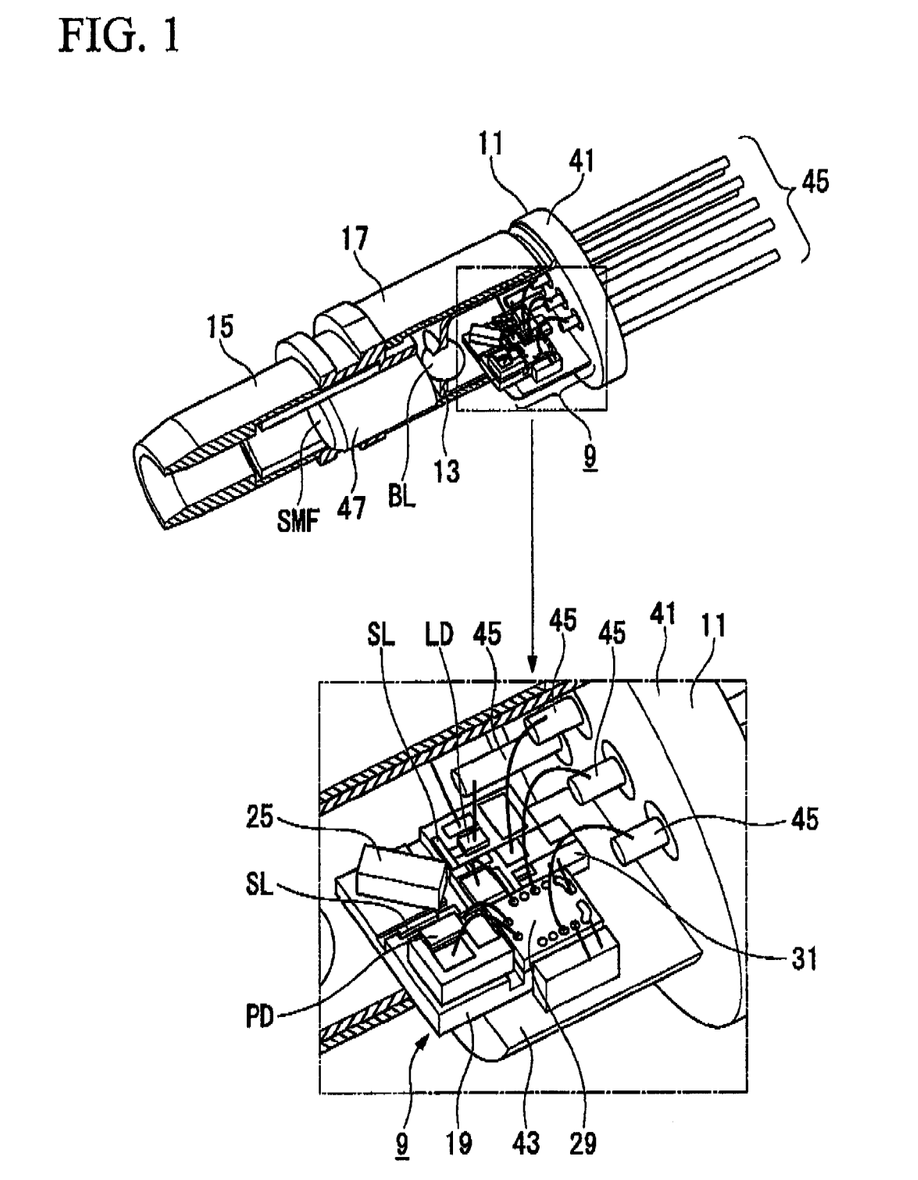
FIG. 1 is a perspective view of a bi-directional optical subassembly (micro-BOSA) of the present embodiment.
Figure 2A:
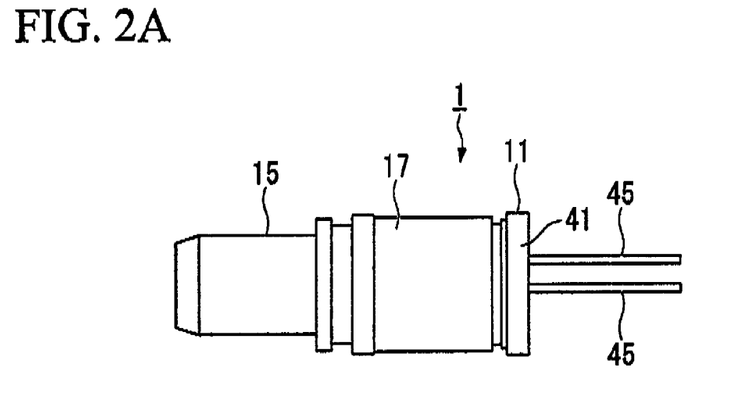
FIG. 2A is a side view of the micro-BOSA.
Figure 2B:
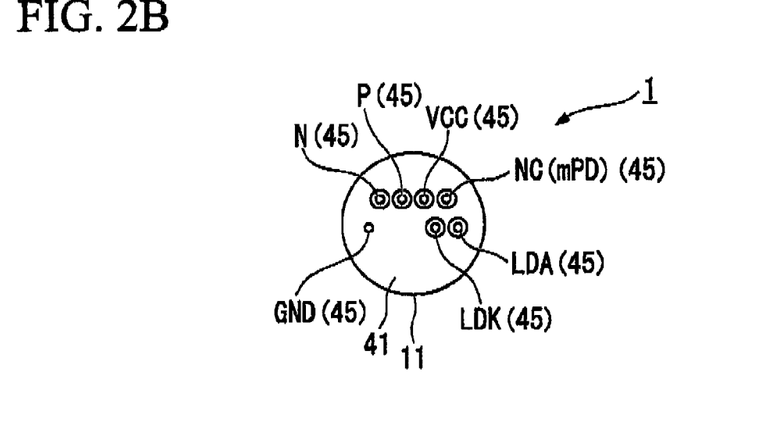
FIG. 2B is an end view of the micro-BOSA.
Figure 2C:
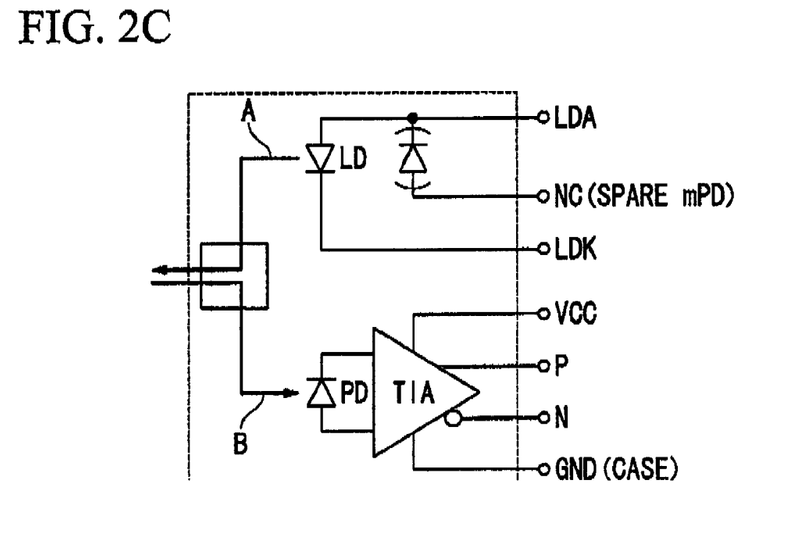
FIG. 2C is a circuit diagram of the micro-BOSA.
Figure 3:
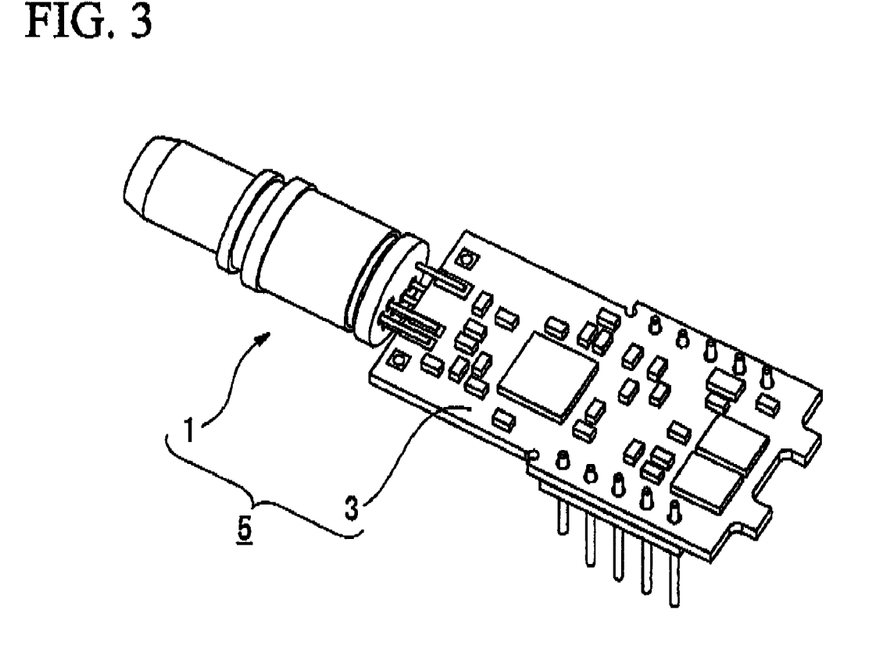
FIG. 3 is a perspective view of an optical transceiver.
Figure 4A:
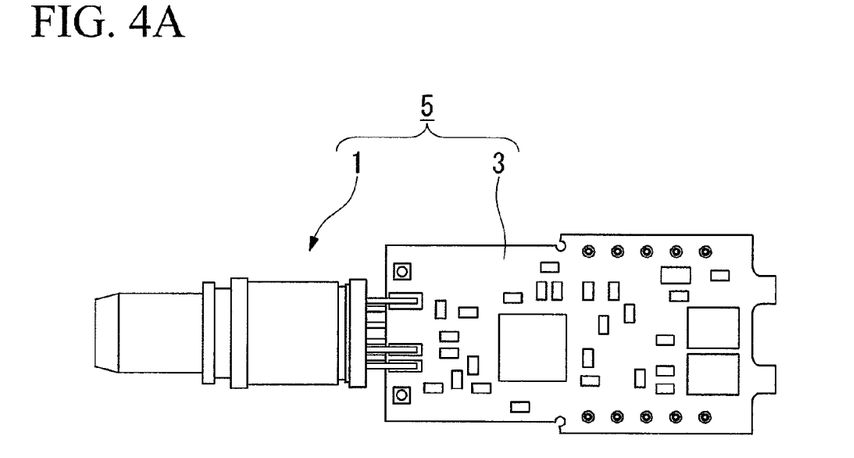
FIG. 4A is a plan view of the optical transceiver.
Figure 4B:
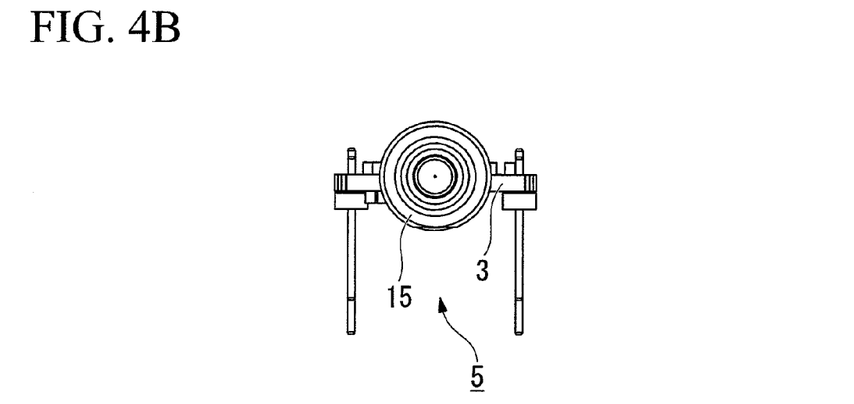
FIG. 4B is an end view of the optical transceiver.
Figure 4C:
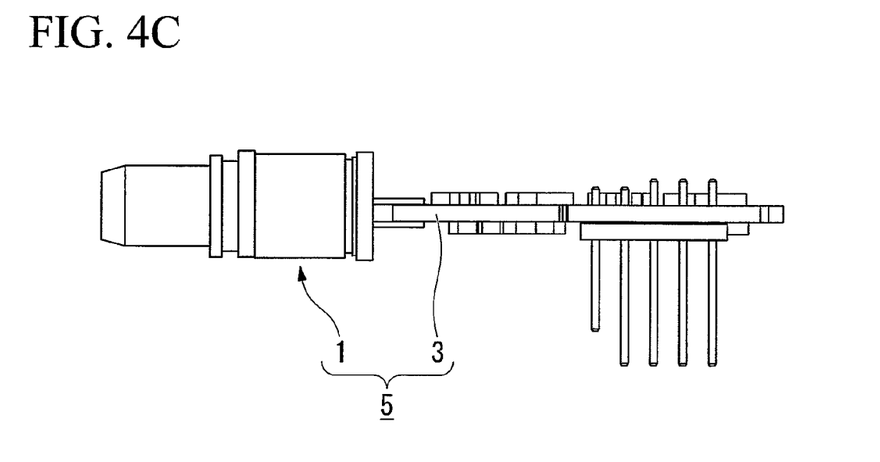
FIG. 4C is a side view of the optical transceiver.
Figure 5:
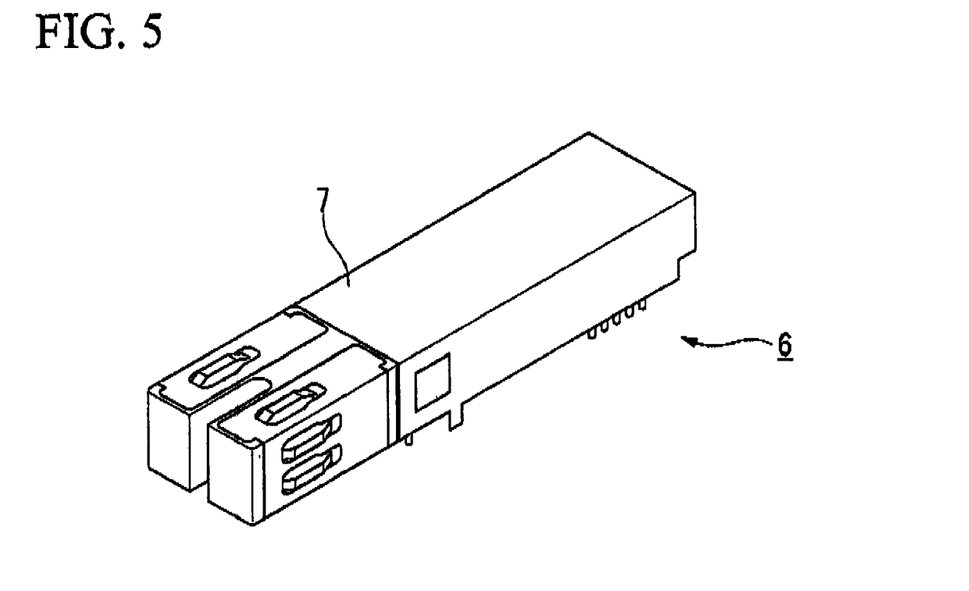
FIG. 5 is a perspective view of an optical transceiver with a casing attached thereto.

FIG. 1 is a perspective view of a micro-compact bi-directional optical subassembly (hereinafter, referred to as "micro-BOSA") 1 according to an embodiment of the present embodiment. FIG. 2A is a side view, and FIG. 2B is an end view of the micro-BOSA 1. FIG. 2C is a circuit diagram of the micro-BOSA 1. FIG. 3 is a perspective view of an optical transceiver assembly 5 in which a printed circuit board 3 (used as a driver and as an electric interface) for transmit and receiving is assembled to the micro-BOSA 1. FIG. 4A is a plan view, FIG. 4B is an end view, and FIG. 4C is a side view of the optical transceiver assembly 5. FIG. 5 is a perspective view of an optical transceiver 6 within a predetermined casing 7. The optical transceiver 6 is a wavelength division multiplex (WDM) optical transceiver for transmitting and receiving on the wavelengths of 1310 nm and 1490 nm.

In summary, the micro-BOSA 1 according to the present embodiment has successfully addressed the problems including stray light as described later with optical devices having at least optical bi-directional functions compactly accommodated in a single can cap (or package).

The micro-BOSA 1 is about 16.4 mm in length and about 6.6 mm in diameter. The micro-BOSA is small enough to be accommodated in a conventional small form factor (SFF) transceiver package. The micro-BOAS 1 appears as a TO-coaxial optical subassembly (OSA).

Referring to FIG. 1, the micro-BOSA 1 essentially includes a micro-BOSA chip 9, a stem 11 on which the micro-BOSA chip 9 is mounted, a cap 13 with a ball lens for covering and sealing the micro-BOSA chip 9 (hereinafter, sometimes referred to as "can cap" or "TO-CAN"), a receptacle 15 (e.g., an SC optical connector) and a cylindrical connecting part 17 for connecting the can cap 13 to the receptacle 15.

Figure 6:
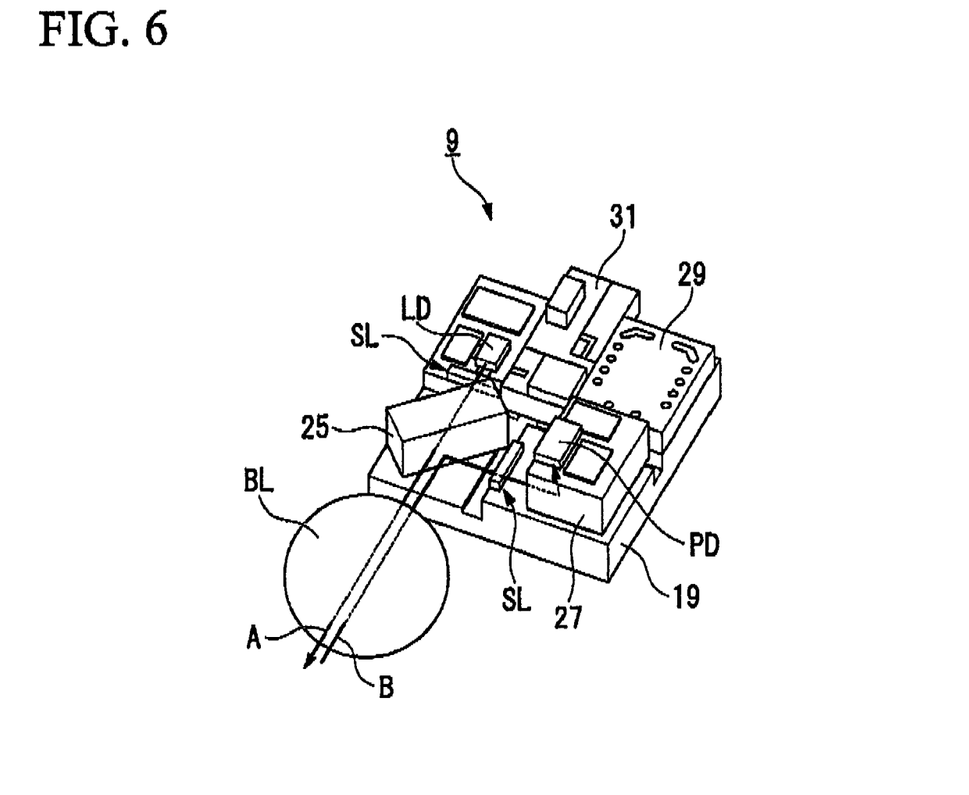
FIG. 6 is a perspective view of a micro-BOSA chip.

Referring to FIG. 6, the micro-BOSA chip 9 includes a silicon substrate 19 (e.g., silicon optical bench, SiOB) of 2.4 mm×2.4 mm, and components to be mounted on the silicon substrate 19. The components include a laser diode LD chip, a photodiode PD chip, two silicon micro lenses SL, and a wavelength division multiplex filter (hereinafter, referred to as a "WDM filter") 25. The PD chip is mounted on the silicon substrate 19 via a glass substrate 27. A transimpedance amplifier (TIA) 29 and a ceramic substrate (i.e., a circuit board 31) are also mounted on the silicon substrate 19.

The LD chip, the PD chip, and the WDM filter 25 can be mass-produced general parts manufactured at a low cost for conventional optical components.

Two silicon micro lenses SL are diffraction lenses to provide a compact bi-directional function of space-coupling type.

As can be seen from FIG. 6, one of the silicon micro lenses SL is disposed between the LD chip and the WDM filter 25. The silicon micro lens SL may be an aspherical proximity lens for collimating light (e.g., 1310 nm) emitted from the LD chip. The other of the silicon micro lenses SL is disposed between the PD chip and the WDM filter 25. The silicon micro lens SL may be an aspherical proximity lens for converging light (e.g., 1490 nm) from the WDM filter 25 and introducing to the PD. In FIG. 6, A denotes an optical path for an output signal on the wavelength of 1310 nm, and B denotes an optical path for an input signal on the wavelength of 1490 nm.

The silicon micro lenses SL can be produced with high precision at a low cost using conventional silicon LSI manufacturing technology. The silicon micro lenses SL are surface-mounted on corresponding V-grooves (not shown) provided on the silicon substrate 19 through passive alignment. In particular, the silicon micro lenses SL can be fixed in a highly precise manner with their side walls physically contacting the corresponding V-grooves.

The PD of the present embodiment may be a PIN photo-diode with an intrinsic semiconductor layer disposed between p-n junctions. The PD chip is mounted with its light receiving surface facing downward. The light passing through the lens at the PD side is slightly diffracted downward, converged and reflected on an end surface (mirror) of the V-groove. Then, the light is incident into the PD chip of an upper side. With reversed wavelengths of the LD and the PD, the present embodiment may also be applied to an OLT.

The applicable scope of to invention may be readily broadened to a triplexer by merely adding an analog PD chip for video signals, a silicon micro lens, and another WDM filter to micro-BOSA chip of the present embodiment.

Figure 8:
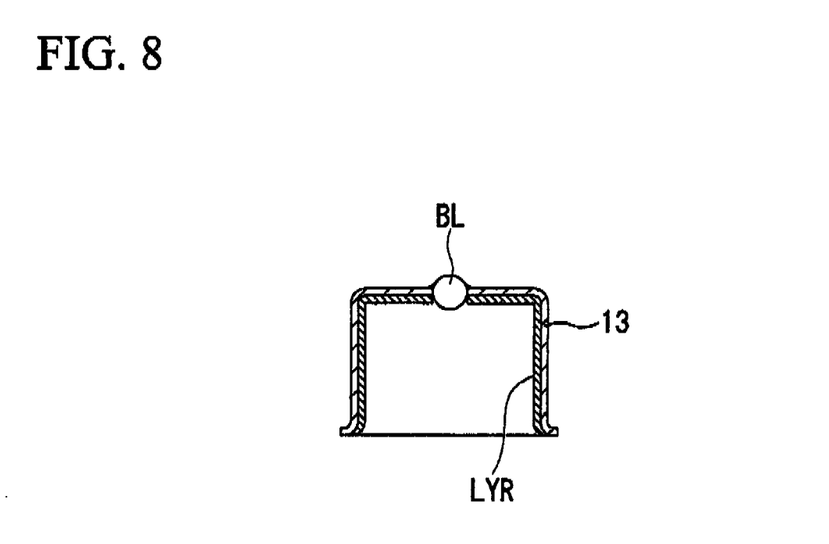
FIG. 8 is a longitudinal sectional view of a can cap.

The can cap 13 with a ball lens essentially includes a cylindrical (i.e., a can-shaped) cap body with a closed end, and a spherical ball lens BL fixed to penetrate at the center of the closed end.

The ball lens BL functions as a coupling lens between the LD chip and the single mode optical fiber (SMF) placed within and connected to the receptacle 15. The ball lens also functions as a coupling lens between the PD chip and the SMF.

Since the ball lens functions as a shared coupling lens, optical axis adjustment (alignment) of both of the LD and the PD can be cared out by merely monitoring the light power of the LD output to the SMF, without monitoring the PD current.

The stem 11 includes a stem disk part 41, a stem protruding part 43 extending from and substantially perpendicular to, the stem disk part 41, and multiple lead pins 45 provided to penetrate the stem disk part 41. As described above, the micro-BOSA chip 9 is mounted on the stem protruding part 43.

As shown in FIG. 2B, the lead pins 45 arranged horizontally in a line above the center of the stem disk path 41 (i.e., the stem 11) are receiver lead pins, and are numbered as N, P, VCC, and NC (spare) from to left. The lead pins 45 arranged horizontally in a line below the center of the stem 11 are transmitter lead pins, and are numbered as GND, LDK, and LDA from the left. The lead pins 45 and their corresponding parts are electrically connected by wire-bonded gold wires (see the thick solid lines in FIG. 1).

The thus arranged lead pins 45 connect and fix the micro-BOSA 1 and the printed circuit board 3 together in a manner in which the lead pins 45 nip the printed circuit board 3 from above and below (see FIG. 4A and FIG. 4C).

One side of the printed circuit board 3 is used for optical transmitting circuits and the other side is used for optic receiving circuits (with this structure, individual chip set may be employed). A ground surface is provided in an intermediate layer of the printed circuit board 3. Since the optical transmitter system and the optical receiver system are separated by to ground layer of the printed circuit board 3, electric crosstalk can be reduced efficiently.

Figure 7:
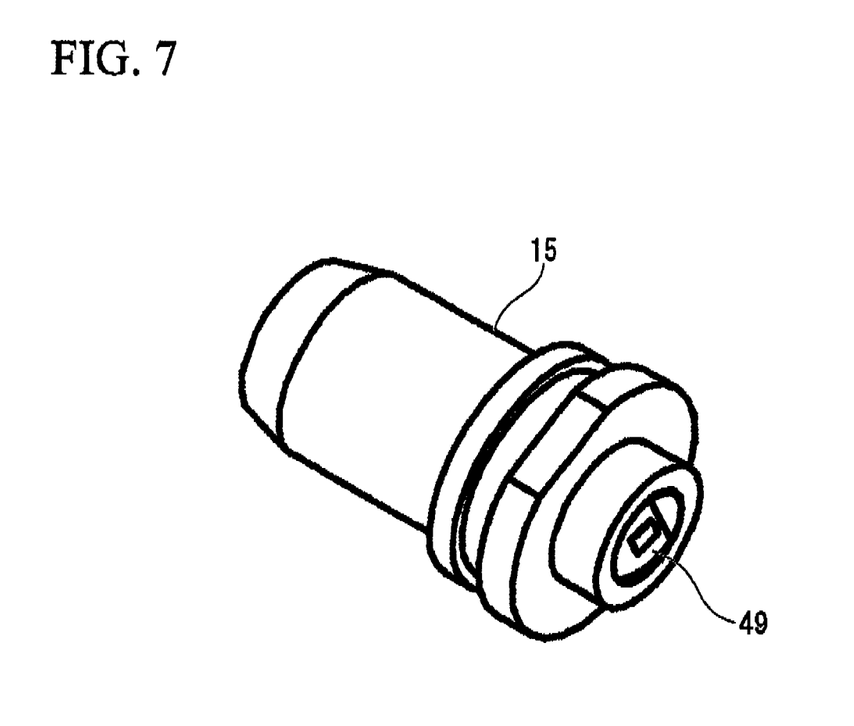
FIG. 7 is a perspective view of a receptacle.

As shown in FIG. 7, the receptacle 15 is a connector for optically connecting the single mode optical fiber SW and the ball lens BL. The receptacle 15 includes a fiber stub 47 made from, for example, zirconia ceramics for holding the SMF. A long wavelength cut-off filter (optical filter 49) for cutting light on the wavelengths longer than 1550 nm is attached to an input/output terminal at an end surface of the receptacle at a small cap side thereof. The end surface is angled at a predetermined angle. For example, in an application of the Ethernet (registered trademark) PON (EPON), light signals having other long wavelength, such as analog video signals of 1550 nm, are delivered. With the structure described above, such light signals can be effectively prevented from reaching the PD or being reflected to the optical fiber. This advantageous effect can be obtained also in pigtail-shaped connectors.

As can be well understood from the foregoing description, defects (i.e., optical crosstalk (i.e., stray light)) and electric crosstalk) that may be contained in a structure in which both of the LD and PD chips are accommodated in a single can cap 13 are successfully remedied. This will be described briefly below.

(1) Control of Stray Light 1

Some of the light emitted from a transmitter LD (both forward and rearward light) fails to be coupled to the fiber or a monitor PD and becomes stray light within the can cap (i.e., package) 13. The stray light is coupled to the receiver PD to generate noise which may impair receiving quality.

To address this problem, two structures (first and second structures) are provided in accordance with the invention. These structures may be used alone or in a superimposed state.

The first structure includes a layer LYR provided on the inner surface of the can cap 13 for absorbing the infrared ray as shown in FIG. 8. The layer LYR may be formed by plate processing, or by depositing resin.

In plate processing, a film for absorbing the infrared ray (i.e., stray light), especially a black-colored nickel film, is plated on the inner surface of the can cap 13. The plated layer (LYR) absorbs the light emitted from the LD so as not to generate stray light. The thickness of the plated layer can be easily controlled. Thus, the plated layer can be made uniformly thin. Further, multiple cap processing may advantageously be done at a time.

An experiment was conducted on infrared my absorption properties of several black-colored plating layers provided on the inner surface of the can cap. The plated layers were formed in the following manner:
(a) electrolysis nickel plating
(b) electroless nickel plating
(c) electrolysis nickel plating after blasting and
(d) electroless nickel plating after blasting.

As a result of the experiment, the infrared absorption property of the "black-colored plating layer formed by (c) electrolysis nickel plating after blasting" was proved to be extremely desirable.

To form the layer by depositing resin, resin which absorbs the infrared ray (i.e., stray light) with high efficiency is applied on the inner surface of the can cap 13. The resin can be applied to a metal (e.g., stainless steel) surface not suited for plating. Thus, the resin can be advantageously applied to commonly available lens caps.

As resin to be deposited, EPO-TEK H62 product name) manufactured by Epoxy Technology Inc. of the United States has been proven suitable from several experiments. EPO-TEK H62 is an industrial functional bonding material used for C-MOS chip coating and ferrite fixing. EPO-TEK H62 is a black-colored, one-fluid material with aluminum filler. EPO-TEK H62 has excellent binding properties and moderate elasticity to any materials including ferrite and glass, and can be stored at room temperature. The above description of EPO-TEK H62 is cited from the resource of Daizo Corporation, Nichimoly Division.

The second structure includes a block disposed between the transmitter LD and the receiver PD to physically intercept the stray light. Since the stray light is generated from the light emitted from the transmitter LD due to coupling loss between the transmitter LD and the lens, the block is provided to prevent the stray light to incident into the receiver PD.

Figure 9:
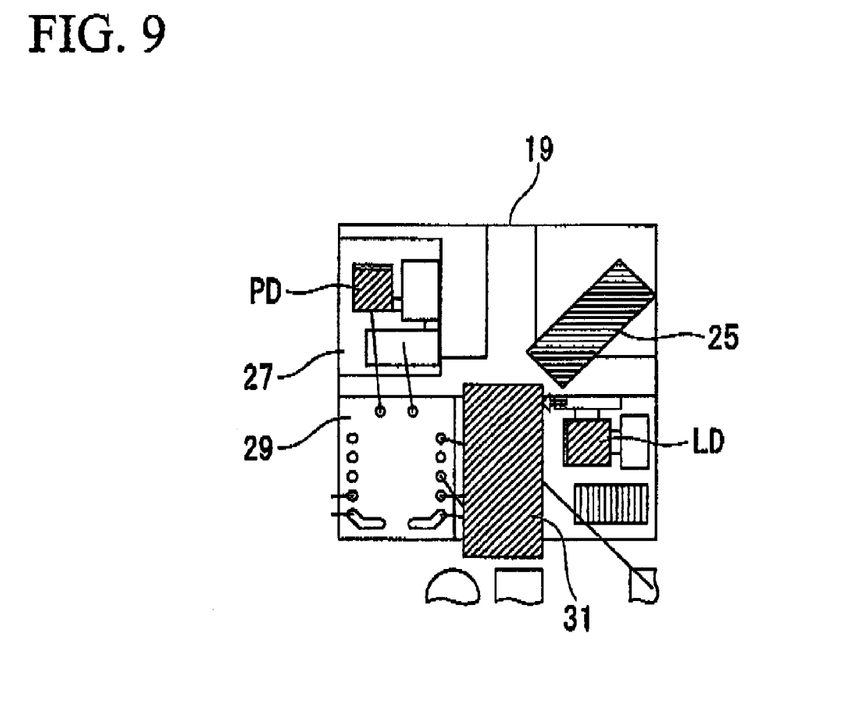
FIG. 9 is a plan view of the micro-BOSA chip.

As can be seen in FIG. 9, the above-mentioned ceramic substrate (i.e., circuit board 31) may function as the block. In FIG. 9, the say light is shown by a bold arrow.

With the second structure, the receiving properties can be improved due to reduced noise, and chips can be mounted densely on the substrate. In particular, a structure in which a one-layer circuit is formed to mount a capacitor for driving various ICs on an alumina ceramic substrate or an aluminum nitride ceramic substrate can be obtained.

An experiment demonstrated that, when the block (i.e., the circuit board 31) has a predetermined height, light (i.e., stray light) from the LD to the PD is significantly reduced.
(2) Control of Stray Light 2

An LD driver of an optical network unit (ONU) used for passive optical network (PON) works in a burst mode. Thus, since output control is difficult in a control method using a monitor PD, the output is controlled without using the monitor PD. No monitor PD is mounted in this structure. Thus, the light emitted behind the LD) directly becomes stray light inside the can cap 13, which may be coupled to the receiver PD.

To address this problem, the following two structures are provided in accordance with the invention so as to absorb the light behind the LD (i.e., stray light).

Figure 10:
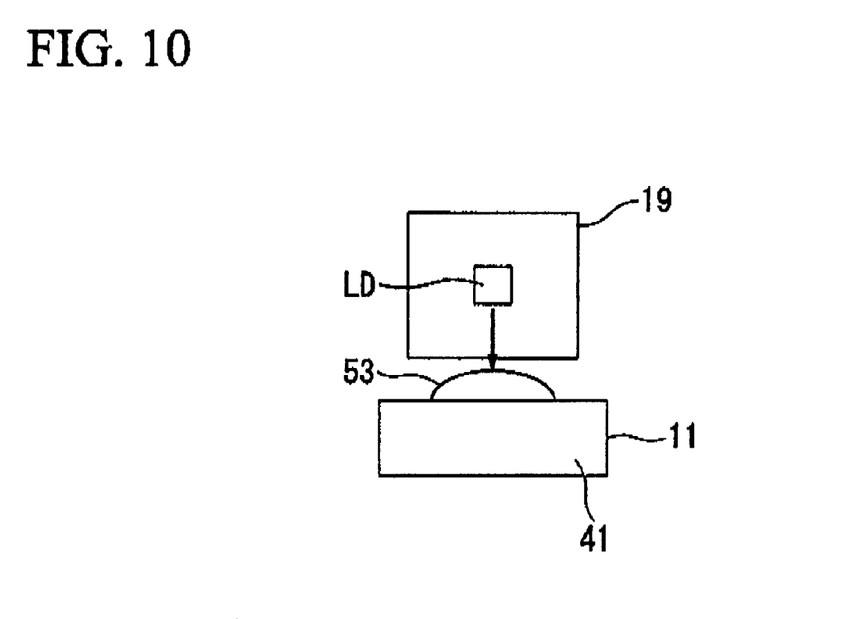
FIG. 10 shows a process of depositing resin on a stem.

The first structure is a potting structure, in which a designated resin is deposited on the stem 11 behind the LD, as shown in FIG. 10. In the second structure, the designated resin is deposited behind the LD on the silicon substrate 19 on which the LD is mounted, as shown in FIG. 11.

Figure 11:
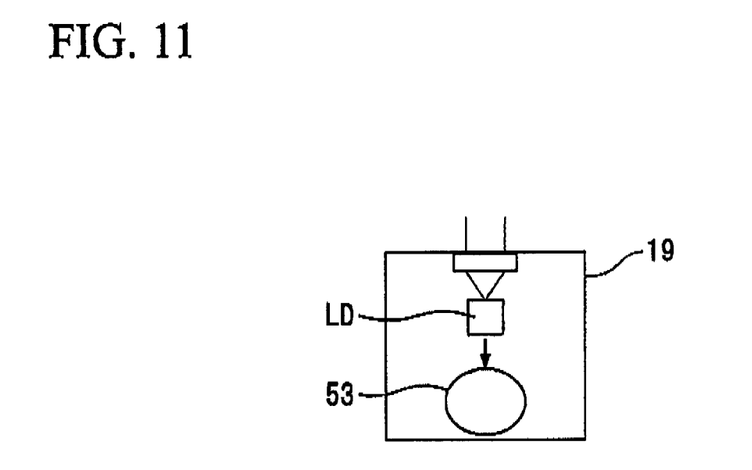
FIG. 11 shows a process of depositing resin on a silicon substrate.

In either structure, the predetermined resin 53 provided behind the LD absorbs the light behind the LD effectively (in FIGS. 10 and 11, the arrow of thick solid line indicates stray light). Experiments demonstrated that, in his structure, as compared with a structure having no resin deposited thereon, the stray light heading for the receiver PD is significantly reduced, the stray light-induced noise is reduced, and the receiving property is significantly improved. The resin suitable for applying the inner surface of the can cap 13 may also be used here.
(3) Control of Electric Crosstalk In the structure with both the LD and PD chips accommodated in the extremely compact can cap 13 as in the present embodiment, signal wirings for transmitting and receiving are short. In particular, the distance between the transmitting circuit and the receiving circuit are as small as about 2 mm, and thus reduction in electric crosstalk is extremely difficult. The exemplary embodiments of the invention, however, successfully address this problem. The following three structures are provided according to the invention.

Figure 12A:
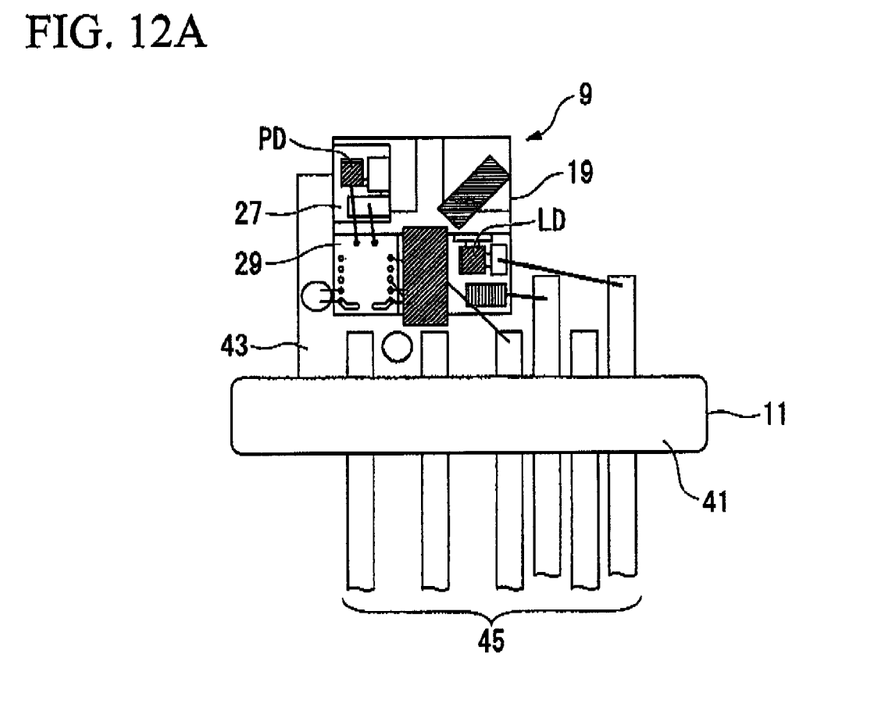
FIG. 12A shows a wiring arrangement of a transmitter and a receiver in the can cap.

As shown in FIG. 12, in the first structure, components are arranged in the can cap 13 such that bonding wires (wrings (gold wires) of the transmitter side) of the transmitter LD and bonding wires (wirings (gold wires) of the receiver side) of the receiver PD are positioned substantially perpendicular to each other, (The thick solid lines in FIG. 12 indicate gold wires.) With this arrangement, crosstalk between the transmitting/receiving wires (gold wires) can be reduced.

Figure 12B:
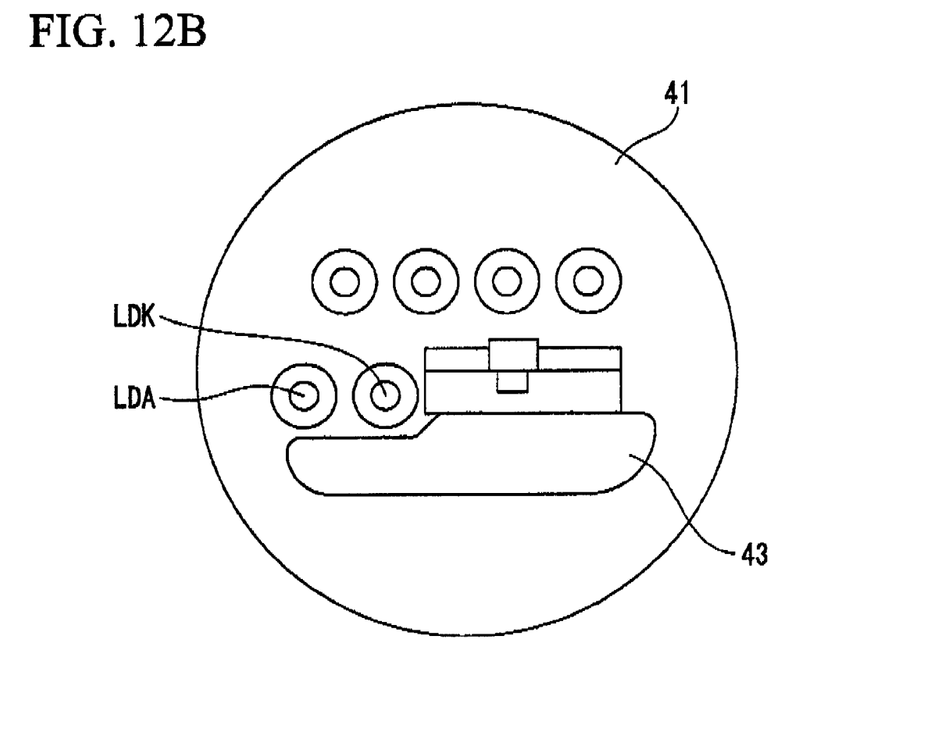
FIG. 12B is a top view of a stem protruding part.

As shown in FIG. 12, in the second structure, transmitter lead pins 45 (two pins 45 are shown in FIG. 12) are provided below the surface of the silicon substrate 19 on the stem 11 (stem disk part 41) at the can cap side. The receiver lead pins 45 (four pins 45 are how in FIG. 12) are provided above the surface of the silicon substrate 19. Ground constituting metal is provided near the transmitter lead pins. This structure can reduce electric crosstalk.

Figure 13:
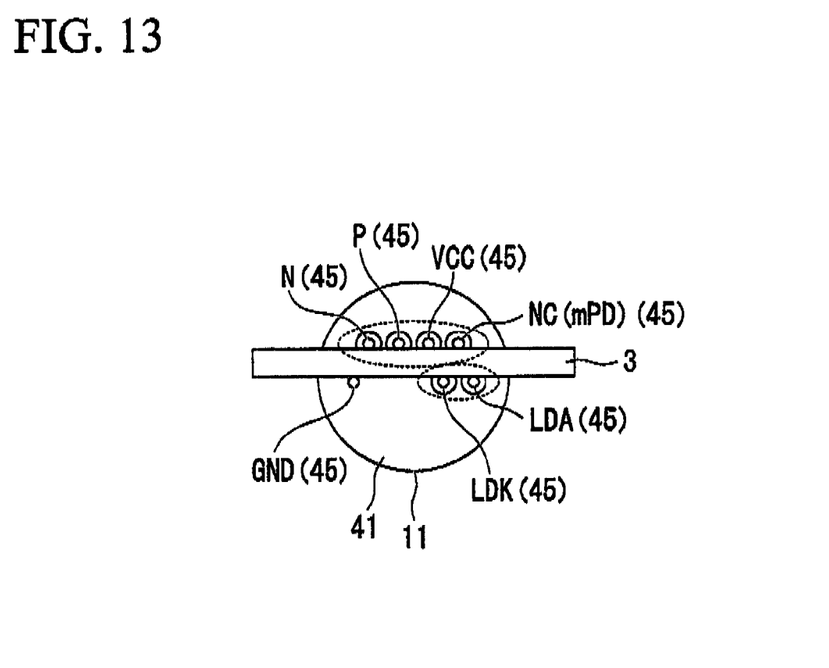
FIG. 13 shows a state in which a printed circuit board is disposed between lead pins projecting from the can cap.

As shown in FIG. 13 and as described above, in the third structure, a series of externally protruding lead pins 45 on the stem 11 (stem disk part 41) at the opposite side of the can cap 13 are divided into two groups: a group of receiver lead pins 45 (N, P, VCC and NC) (shown at the upper side in FIG. 13), and a group of transmitter lead pins 45 (LDK and LDA) and a lead pin 45 for grounding (shown at the lower side in the FIG. 13). The printed circuit board 3 having a grounding layer as an inner layer is disposed between the groups. Each lead pin 45 is connected and fixed to the printed circuit board 3 in a straightened state.

With the above-described three structures, namely, (1) the structure in which transmitter and receiver bonding wires arm disposed substantially perpendicular to each other at the inner side sealed by the can cap 13; (2) the structure in which the group of transmitter lead pins and the group of receiver lead pins are disposed above and below the surface of the silicon substrate, and a ground metal is provided near the group of transmitter lead pins; and (3) the structure in which the printed circuit board 3 having the ground layer as an inner layer is interposed to divide the load pins prong from the outside of the cap seal into two groups: transmitter lead pins and receiver lead pins, electric crosstalk can be significantly reduced and radiated noise of the transmitter is significantly separated.

(4) Control of Return Loss

When an analog video signal (of e.g., 1550 nm) is cut off within the optical transceiver, the cut signal becomes stray light and then causes noise in digital receiving signals.

To address this problem, as described above, in accordance with to invention, a structure is provided in which the end surface of the receptacle is made as a polished surface angled at a predetermined angle (e.g., 6 to 8 degrees), and an analog video signal cut-off filter (a long wavelength cut-off filter 49) is attached to the end surface.

With this structure, in which the filter 49 is attached to the angled polished surface of the receptacle 15 with the filter surface facing outward, the analog signal is reflected at the filter 49, directed toward a clad of the fiber SMF, and then absorbed in the fiber coating. Thus, as compared with the sc in which the filter is formed inside the can cap, since the cut analog video signal is seldom introduced into the digital receiving system and removed outside, the receiving quality of the digital signal is no longer influenced by the analog signal.

Referring now to FIGS. 14A to 14H, an exemplary manufacturing process of micro-BOSA 1 an embodiment of the present invention will be described briefly.

(A) Stem Numbering

Figure 14A:
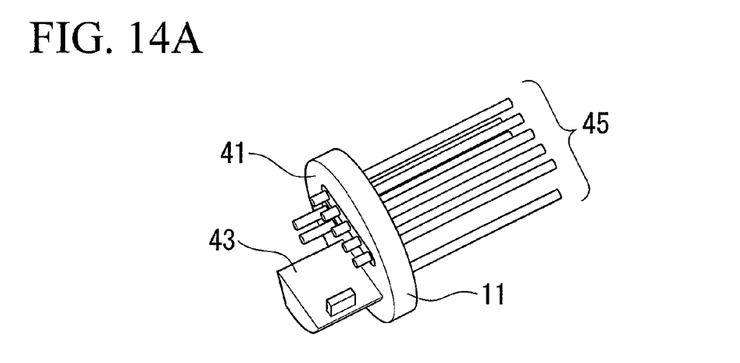
FIG. 14A shows a process of numbering the stems.

A lot number is given to the stem 11 by laser. Then, potting of the predetermined resin 53 for the stray light is conducted (not shown).

(B) Dice Bonding (DB) of Micro-BOSA Chip

Figure 14B:
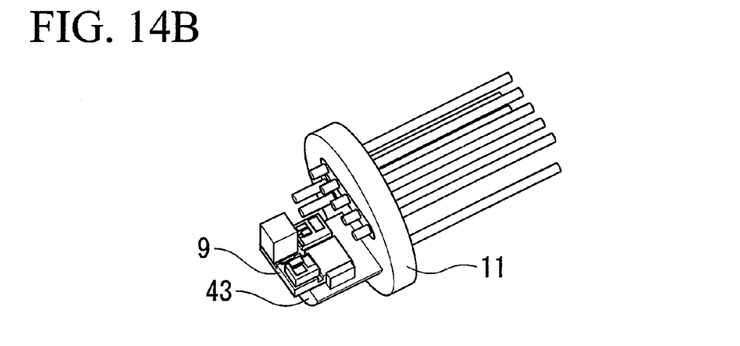
FIG. 14B shows a process of dice bonding (DB) the micro-BOSA chip.

After application of silver paste, the micro-BOSA chip 9 is mounted on the stem 11 (stern protruding part 43).

(C) Mounting Circuit Board

Figure 14C:
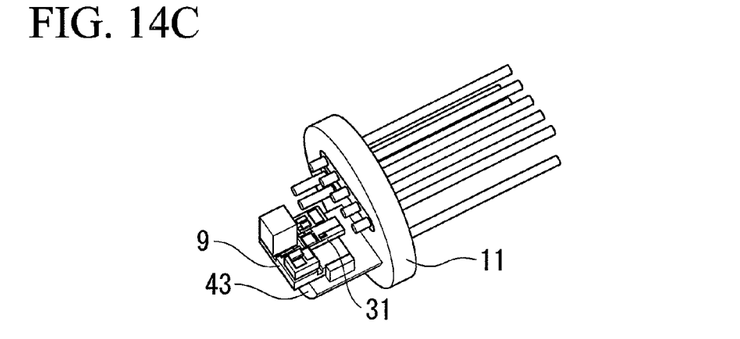
FIG. 14C shows a process of mounting the circuit board.

After application of silver paste, the ceramic substrate (circuit board 31) is mounted. Similarly, a capacitor is mounted.

(D) TIA DB

Figure 14D:
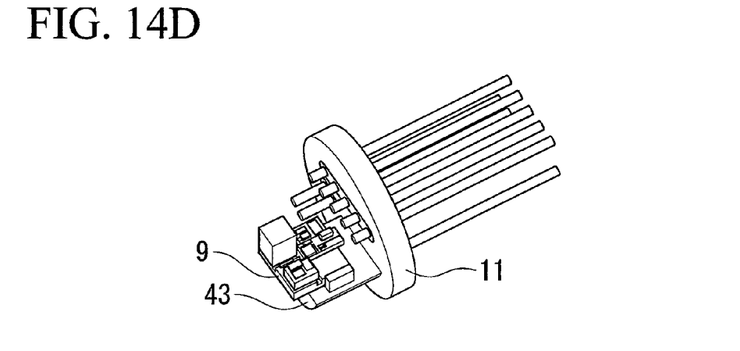
FIG. 14D shows a process of dice bonding a transimpedance amplifier (TIA).

After application of silver paste, the transimpedance amplifier (TIA) 29 is mounted.

(E) Vacuum Baking

Figure 14E:
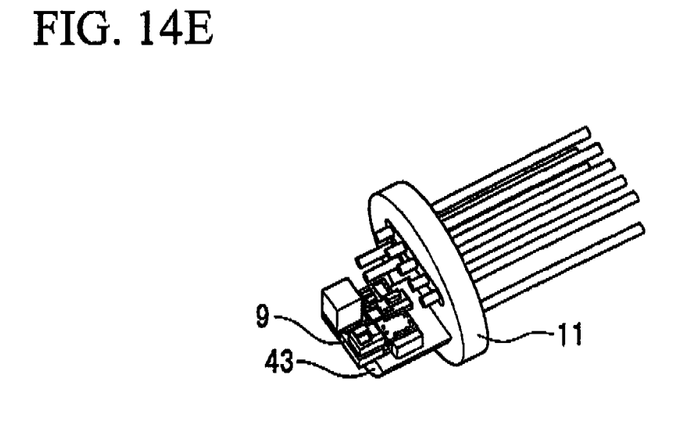
FIG. 14E shows a process of vacuum baking.

Vacuum baking (i.e., vacuum drying) is conducted at 140° C. for four hours.

(F) and (G) Cap Alignment Fixation

Figure 14F:
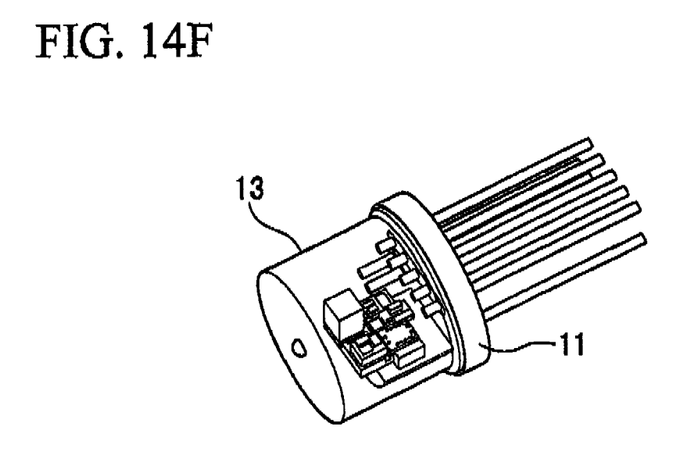
FIG. 14F shows a process of alignment fixation of the cap.
Figure 14G:
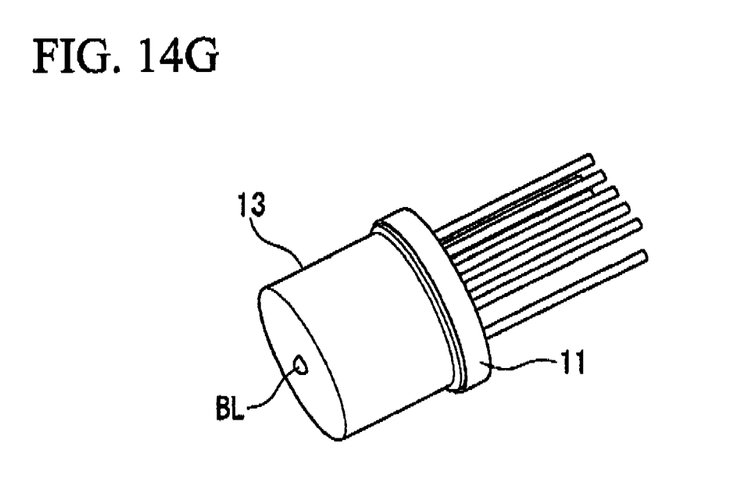
FIG. 14G is a drawing similar to FIG. 14F.

The can cap 13 is attached to the stem 11 by projection welding so that the micro-BOSA chip 9 is sealed by the can cap 13 with a ball lens BL. Then a helium leak check, a bubble leak check, an elect-optics characteristic test, and a visual examination are conducted.

(H) Alignment YAG

Figure 14H:
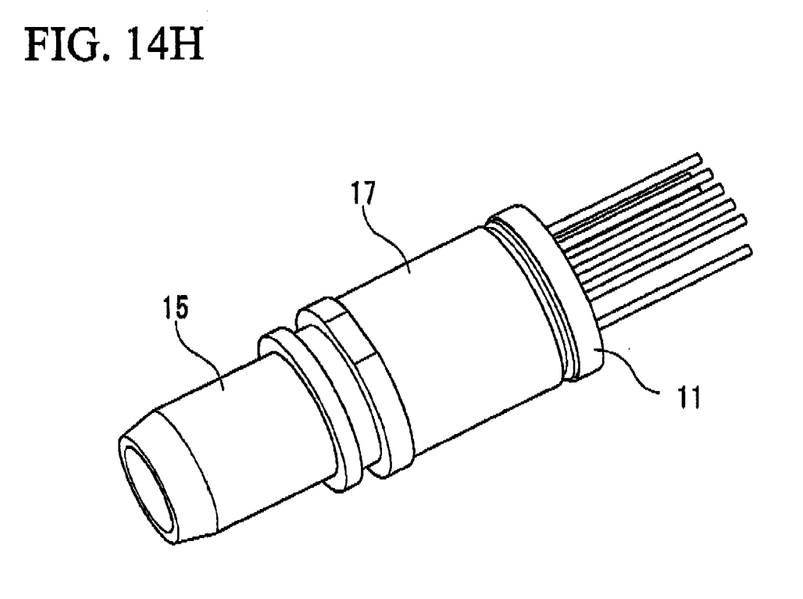
FIG. 14H shows a process of YAG welding.

A cylindrical connecting part 17 is placed on the can cap 13. After alignment, YAG laser welding (i.e., penetration welding) is conducted, and the cylindrical connecting part 17 is fixed.

Then, the receptacle 15 is placed on the cylindrical connecting part 17. After alignment, YAG laser welding (fillet welding) is conducted, and the receptacle 15 is fixed.

After welding, a function test and a visual examination are conducted. In this manner, the micro-BOSA 1 is manufactured.

The inventors developed a prototype of the micro-BOSA in accordance with the invention and examined the optical and optoelectrical characteristics at 25° C. The resultant characteristics were desirable:

threshold current: 8.0 mA;
slope efficiency: 137 mW/A;
return loss: 50 dB or more (1490 nm);
return loss: 42 dB (1550 nm);
return loss: 13 dB (1310 nm);
cut filter loss: 46.5 dB (1310 nm to the PD);
cut filter loss: 43 dB (1550 nm to the PD); and
optical isolation: 47 dB (1310 nm from the LD to the PD).

The inventors also developed a prototype of an optical transceiver which incorporates the micro-BOSA in accordance with the invention, and examined its optical characteristics. As a result, it was proved that the optical transceiver had, in two-way communication at 1.25 Gbit/s, the minimum light-receiving sensitivity of −28.5 dBm which is low enough for use as a Gigabit Ethernet (registered trademark) PON transceiver. It is to be noted that the micro-BOSA can also be applied to the OLT.

An embodiment of the inventive micro-BOSA with a simple structure can be easily manufactured and successfully addresses the above discussed problems such as optical and electric crosstalk. Such a micro-BOSA contributes to further improvement in bi-directional optical communication.

Although the invention has been described and illustrated in detail with reference to specific embodiments, the description is not to be construed as limiting the invention. Other embodiments of the invention will become apparent to those skilled in the art from the specification of the present application. Various modifications can be made to the disclosed embodiments without departing the scope of the invention defined by the claims.

The invention claimed is:

1. A bi-directional optical subassembly, comprising:
a laser diode;
a photodiode;
a stem on which the laser diode and the photodiode are mounted;
a cap, which cooperates with the stem and seals the laser diode and the photodiode; and
a crosstalk reducing structure, which reduces at least one of optical and electrical crosstalk, wherein
the stem comprises a disk-shaped base, and a protruding part protruding vertically from the base and having a silicon substrate thereon, on which the laser diode and the photodiode are mounted; and
a group transmitter lead pins and a group of receiver lead pins, which penetrate the stem are provided; and
a stem protruding part, which has a ground potential is disposed near the group of transmitter lead pins.

2. A bi-directional optical subassembly according to claim 1, wherein the crosstalk reducing structure comprises a layer which is formed on an inner surface of the cap and which absorbs an infrared ray.

3. A bi-directional optical subassembly according to claim 2, wherein the layer comprises a black-colored plating layer.

4. A bi-directional optical subassembly according to claim 2, wherein the layer comprises a resin layer.

5. A bi-directional optical subassembly according to claim 1, wherein the crosstalk reducing structure comprises a block, which is disposed between the laser diode and the photodiode, and which physically prevents stray light from traveling between the laser diode and the photodiode.

6. A bi-directional optical subassembly according to claim 5, wherein the block comprises a circuit board for at least one of the laser diode and the photodiode.

7. A bi-directional optical subassembly according to claim 1, wherein the crosstalk reducing structure comprises resin which is disposed behind the laser diode, and which absorbs any light behind the laser diode.

8. A bi-directional optical subassembly according to claim 7, further comprising a silicon substrate on which the laser diode and the photodiode are mounted, wherein the resin is disposed on the silicon substrate.

9. A bi-directional optical subassembly according to claim 7, wherein:
the stem comprises a disk-shaped base, and a protruding part protruding vertically from the base and said protruding part having a silicon substrate thereon, on which the laser diode and the photodiode are mounted; and
the resin is disposed on the disk-shaped base of the stem.

10. A bi-directional optical subassembly according to claim 1, further comprising a transimpedance amplifier, which amplifies a signal received from the photodiode,
wherein the crosstalk reducing structure comprises:
a first pair of wires, which connects the transmitter lead pin to at least one of the laser diode and an electrode pad connected to the laser diode;
a second pair of wires, which connects the transimpedance amplifier with at least one of the photodiode and an electrode pad connect to the photodiode; and
a third pair of wires, which connects the transimpedance amplifier to the receiver lead pin, and
wherein the first and second pairs of wires are substantially perpendicular to one another.

11. A bi-directional optical subassembly according to claim 1, further comprising:
a receptacle; and
an optical filter disposed at an optical input/output terminal at a cap side of the receptacle, and said optical is angled at a predetermined angle with respect to an optical axis.

12. A bi-directional optical subassembly, comprising:
a laser diode;
a photodiode;
a stem on which the laser diode and the photodiode are mounted;
a cap, which cooperates with the stem and seals the laser diode and the photodiode; and
a crosstalk reducing structure, which reduces at least one of optical and electrical crosstalk, wherein:
the stem comprises a disk-shaped base, and a protruding part protruding vertically from the base, said protruding part having a silicon substrate thereon on which the laser diode and the photodiode are mounted;
a plurality of lead pins for electrical connection, which include transmitter lead pins and receiver lead pins penetrate the stem; and
the lead pins are divided into two groups, a group of transmitter lead pins and a group of receiver lead pins, on opposite sides of the stem protruding part and parallel to one another, and a printed circuit board having a ground layer as an inner layer is disposed between the groups of the lead pins.

13. An optical transceiver, comprising:
a bi-directional optical subassembly which comprises: a laser diode, a photodiode, a cap, which seals the laser diode and the photodiode cooperating with a stem, and a crosstalk reducing structure for reducing at least one of optical and electrical crosstalk;
a printed circuit board, which transmits and receives light for the bi-directional optical subassembly; and
a casing for covering the bi-directional optical subassembly and the printed circuit board, wherein
the stem comprises a disk-shaped base, and a protruding part protruding vertically from the base and, said protruding part having a silicon substrate thereon, on which the laser diode and the photodiode are mounted; and
a group of transmitter lead pins and a group of receiver lead pins, which penetrate the stem are disposed; and
a stem protruding part, which has ground potential, is disposed near the group of transmitter lead pins.

14. An optical transceiver according to claim 13, wherein the crosstalk reducing structure comprises a layer which is formed on an inner surface of the cap and absorbs an infrared ray.

15. An optical transceiver according to claim 13, wherein the crosstalk reducing structure comprises a block which is disposed between the laser diode and the photodiode, and which physically prevents stray light from traveling from the laser diode to the photodiode.

16. An optical transceiver according to claim 13, wherein the crosstalk reducing structure comprises resin which is disposed behind the laser diode and which absorbs the light behind the Laser Diode.

17. An optical transceiver according to claim 13, further comprising a transimpedance amplifier, which amplifies a receiving signal from the photodiode,
wherein the crosstalk reducing structure comprises:
a first pair of wires which connects the transmitter lead pin with at least one of the laser diode and an electrode pad connected to the laser diode;
a second pair of wires which connects the transimpedance amplifier with at least one of the photodiode and an electrode pad connected to the photodiode; and
a third pair of wires which connects the transimpedance amplifier to the receiver lead pin, and
wherein the first and second pairs of wires are substantially perpendicular to one another.

18. An optical transceiver according to claim 13, further comprising:
a receptacle; and
an optical filter disposed at an optical input/output terminal at a cap side of the receptacle, and said optical filter is angled at a predetermined angle with respect to an optical axis.

* * * * *